(12) United States Patent
Wenske et al.

(10) Patent No.: US 8,699,647 B2
(45) Date of Patent: Apr. 15, 2014

(54) FAST PHASE ALIGNMENT FOR CLOCK AND DATA RECOVERY

(75) Inventors: Holger Wenske, Freising (DE); Anthony Sanders, Haar (DE); Christian Kreuzer, Munich (DE)

(73) Assignee: Intel Mobile Communications GmbH, Neubiberg (DE)

( * ) Notice: Subject to any disclaimer, the term of this patent is extended or adjusted under 35 U.S.C. 154(b) by 604 days.

(21) Appl. No.: 12/490,185

(22) Filed: Jun. 23, 2009

(65) Prior Publication Data
US 2010/0322367 A1 Dec. 23, 2010

(51) Int. Cl.
*H04L 7/00* (2006.01)
(52) U.S. Cl.
USPC .......................... 375/355; 375/371
(58) Field of Classification Search
USPC .......... 375/355, 326, 376, 373, 371; 713/500; 326/93; 386/204
See application file for complete search history.

(56) References Cited

U.S. PATENT DOCUMENTS

| | | | | |
|---|---|---|---|---|
| 7,532,697 | B1* | 5/2009 | Sidiropoulos et al. | 375/376 |
| 2001/0033188 | A1* | 10/2001 | Aung et al. | 327/141 |
| 2004/0158420 | A1* | 8/2004 | Kim et al. | 702/66 |
| 2005/0069071 | A1* | 3/2005 | Kim et al. | 375/355 |
| 2005/0201491 | A1* | 9/2005 | Wei | 375/326 |
| 2005/0238126 | A1* | 10/2005 | Ribo et al. | 375/355 |
| 2006/0045224 | A1* | 3/2006 | Cranford et al. | 375/355 |
| 2008/0075221 | A1* | 3/2008 | Lai | 375/376 |
| 2008/0137790 | A1* | 6/2008 | Cranford et al. | 375/357 |
| 2010/0002822 | A1* | 1/2010 | Arima et al. | 375/371 |

* cited by examiner

*Primary Examiner* — Aristocratis Fotakis
(74) *Attorney, Agent, or Firm* — Eschweiler & Associates, LLC (57) ABSTRACT

Disclosed herein are systems and methods for fast phase alignment and clock and data recovery. Systems and methods may include a fast phase alignment component configured to generate a selected phase signal based on a characteristic of an incoming signal. A clock and data recovery component may also be configured to receive the selected phase signal and perform a clock and data recovery function on the incoming signal using the selected phase signal.

15 Claims, 5 Drawing Sheets

FAST PHASE ALIGNMENT FOR CLOCK AND DATA RECOVERY

BACKGROUND

In Burst-mode high-speed data signal operations, serial signals are received on an infrequent basis and may have longer periods of inactivity than continuous mode applications. Although the burst-mode signals are known to be synchronous with a clock timing, they still require a clock and data recovery circuit to phase lock onto the signal. The conventional loop filter of a clock and data recovery circuit needs a long settling time if the phase relation to the incoming signal is not known. Minimizing the amount of settling time would be an advantageous improvement for Burst-mode high-speed serial transceivers.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Disclosed herein are systems and methods for detecting the edge or slope of an incoming signal.

In one embodiment, a system includes a fast phase alignment component configured to perform fast phase alignment function by generating a selected phase signal based on an edge of an incoming signal. The system also includes a clock and data recovery component configured to receive the selected phase signal and perform a clock and data recovery function on the incoming signal using the selected phase signal.

According to another embodiment, a method includes performing a fast phase alignment function to determine a selected phase signal that has a phase characteristic based on a characteristic of an incoming signal and performing a clock and data recovery function on the incoming signal using the selected phase signal.

The systems and methods described by way of example herein may be implemented using electronic hardware, mechanical hardware, and/or computer software. For example, one skilled in the art will appreciate that the systems and methods described herein may be implemented using solid state and/or other electrical components, including active and passive devices, such as transistors, logic gates, capacitors, resistors, inductors, and so forth. Many specific details are set forth in the following description and in the accompanying figures to provide a thorough understanding of various implementations. One skilled in the art will understand, however, that the subject matter described herein may have additional implementations, or that the concepts set forth may be practiced without several of the details described in the following description.

Exemplary System

Figure 1:
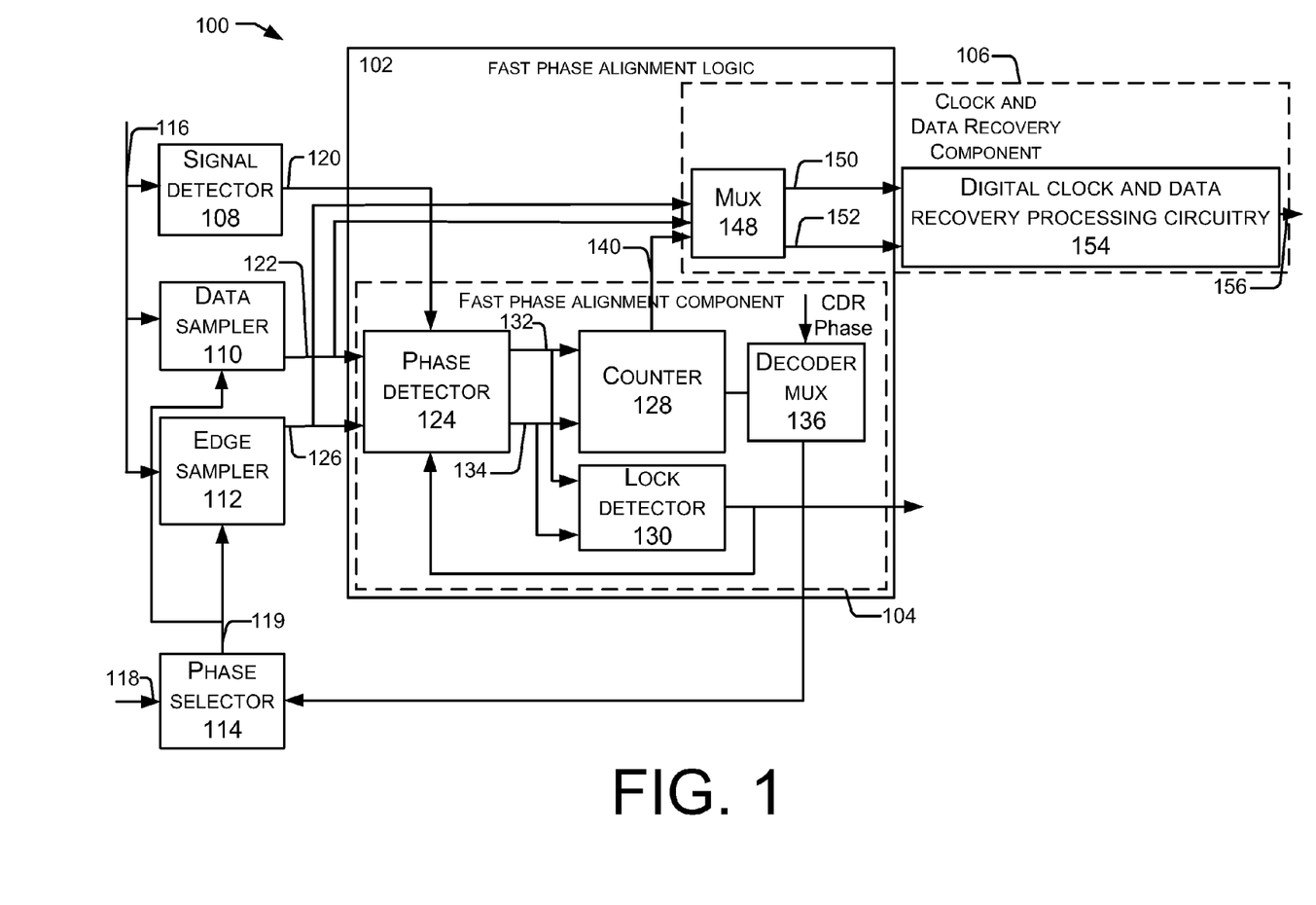
FIG. 1 is a simplified schematic diagram of a system for performing a fast phase alignment function and digital clock and data recovery.

FIG. 1 illustrates one example of a system 100 to implement the detection of the edge or slope of an incoming signal using fast phase alignment logic 102. The fast phase alignment logic 102 includes at least a portion of a fast phase alignment component 104 and at least a portion of a clock and data recovery (CDR) component 106. The fast phase alignment logic 102, the fast phase alignment component 104, and the clock and data recovery (CDR) component 106 may be implemented on one or more integrated circuit chips.

In one embodiment, the system 100 is implemented in hardware and/or software and includes the fast phase alignment component 104, the clock and data recovery (CDR) component 106, a signal detector 108, a data sampler 110, an edge sampler 112, and a phase selector 114. The system 100 is configured such that an incoming signal, such as data burst or other communication signal from another circuit or integrated circuit chip (not shown), is provided along a path 116. The signal detector 108 detects the incoming signal, or a signal accompanying the incoming signal (e.g. in advance of the incoming signal), and enables or prompts the fast phase alignment component 104 to perform a fast phase alignment function on the incoming signal. For example, the signal detector 108 may switch the fast phase alignment component 104 from a deactivated, or "off," state to an activated, or "on," state via, for example, the incoming signal or the signal accompanying the incoming signal provided along a path 120.

The incoming signal along the path 116 is also received by one or more samplers, such as the data sampler 110 and the edge sampler 112. The phase selector 114, which may be activated when the fast phase alignment component 104 is activated, is configured to supply one or more internally generated clock signals, which may be phase shifted relative to one another, to the one or more samplers that are receiving the incoming signal. According to one example, the phase selector 114 receives, monitors, or otherwise detects an internally generated clock signal along a path 118. The phase selector 114 may vary the phase of the internally generated clock signal in order to sample different points of the incoming signal based on the rising and/or falling edge of the clock signal or phase adjusted clock signal (hereinafter collectively referred to more generally as "phase adjusted clock signals" or "clock phases").

The one or more samplers are configured to sample the incoming signal(s) based on the rising and/or the falling edges of the phase adjusted clock signal. The data sampler 110 is configured to analyze the incoming signal from the path 116 based on one edge of the phase adjusted clock signal and provide a first value along path 122 to the phase detector 124. For example, the data sampler 110 may sample the incoming signal based on the rising edge of the phase adjusted clock signal. The edge sampler 112 analyzes the incoming signal from the path 116 based on a second edge of the internally generated clock signal and provides a second value along a path 126 to the phase detector 124. For example, the edge sampler 110 may sample the incoming signal based on the falling edge of the phase adjusted clock signal. The first and second values output by the data sampler 110 and edge sampler 112, respectively, may correspond to "high" or "low" values, "0" or "1" values, or other design specific values as will be appreciated by one skilled in the art.

The phase detector 124 is configured to receive, from the one or more samplers, information regarding the sampling(s). For example, if the incoming signal along the path 116 is sampled based on the rising and falling edge of the phase adjusted clock signal such that the incoming signal is determined to have a "high" value at both sampling points, the phase detector may detect this scenario as a first condition; if the incoming signal is determined to have a "high" value at one sampling point, but a "low" value at the other sampling point, the phase detector may detect this scenario as a second condition; if the incoming signal is sampled as "low" at both sampling points, the phase detector may detect this scenario as a third condition; and so forth. Thus, the phase detector is configured to detect information or characteristics, such as an edge location, with regard to the incoming signal.

The phase detector 124 provides information on the incoming signal in the form of an increment/decrement signal and a direction signal. The increment/decrement signal and direction signals are provided to the counter 128 and the lock detector 130 along paths 132 and 134. The increment/decrement signal may indicate that valid information was derived from the sampling of the input signal, while the direction signal enables the counter to increment or decrement according to the direction signal's value. The direction signal may indicate the direction that the phase needs to be adjusted to obtain information regarding a rising or falling edge of the incoming signal along path 116.

The counter 128 receives, collects, and/or stores information on the incoming signal. For example, the increment/decrement signal may be utilized to determine the number iterations that the phase adjusted clock signal has been phase adjusted. The direction signal may be utilized to determine if the phase of the phase adjusted signal should be adjusted in a different direction than the previous phase adjustment. Such a change in direction may additionally or alternatively be used to determine that the edge of the incoming signal has been approximated or located.

The counter 128 is configured to provide a signal to a decoder multiplexer 136, which directs the phase selector 114 to provide another phase adjusted clock signal along a path 166 by selecting another phase of the internally generated clock signals. The phase of the phase adjusted clock signal provided along path 119 may be adjusted or incremented in one direction or another based on the signal provided by the counter 128.

The fast phase alignment component 104 thereby determines the location, or an approximation of the location, of a rising or falling edge or slope of the incoming signal provided along the path 116 by adjusting or incrementing the phase of the clock signal in one direction or another. Thus, if the phase detector 124 detects that both of the sampling points selected based on the phase of a first phase adjusted clock signal (i.e., corresponding to the rising and falling edges of a phase adjusted clock signal) relate to "high" points on the incoming signal, the phase of the phase adjusted clock signal may be adjusted in one direction. If the phase detector 124 then detects that one or both of the sampling points selected based on the phase of a second phase adjusted clock signal correspond to "low" points on the incoming signal, the phase detector may detect that the phase of the clock would need to be adjusted in the opposite direction to locate an edge of the incoming signal. The lock detector 130 may be configured such that it detects the direction change and determines and/or records this condition as a "locked-on" condition. Alternatively, this direction change condition may be used to provide another signal from the phase selector that has a phase between the first and second phase adjusted clock signals.

The process of adjusting the phase may be continued until a suitable phase is selected, at which time the lock detector 130 may be configured to recognize the signal to be "locked-on," i.e., the phase of the phase adjusted clock signal may be selected as a phase that approximates a rising or falling edge of the incoming signal. The lock detector 130 provides this "locked-on" information to the phase detector 124, which may disable, deactivate, and/or power down the phase detector 124 or, more generally, the fast phase alignment component 104. The counter 128 detects that the phase detector 124 is disabled, disengaged, and/or powered down and stores the phase of the previous phase adjusted clock signal for the purposes of providing this signal or a signal associated with this signal as a selected phase signal to the CDR component 106. The phase of the previous phase adjusted clock signal may be stored as a count. Thus, a first count may correspond to a first phase adjusted clock signal, the second count may correspond to a second phase adjusted clock signal and so forth.

Once the fast phase alignment component 104 has been used to determine the selected phase signal, the selected phase signal is provided to the CDR component 106. The selected phase signal serves as at least an approximation of the location or phase of an edge of an incoming signal, which is utilized for clock and data recovery to further process and/or sample the data from the incoming signal. The locked-on signal may also be provided to the CDR component 106 and may be utilized as an indication that the selected phase signal has been determined by the fast phase alignment component 104. This indication may be used to switch the system 100 from operating using the fast phase alignment component 104 to operating using the CDR component 106 for clock and data recovery. The CDR component 106 is configured to receive the selected phase signal and the locked-on signal and to perform a clock and data recovery function on the incoming signal using the selected phase signal. Thus, the clock and data recovery performed using the CDR component 106 commences with the selected phase signal and may need only small corrections of the clock phase to determine the optimum sampling point. The determination process is well understood in the art and, thus, not elaborated herein.

The multiplexer 148 of the CDR component 104 is configured to receive sampling information from the data sampler 110, the edge sampler 112, and the selected phase signal from the counter 128. The data sampler 110 and the edge sampler 112 are initially enabled using the preselected phase provided via the decoder multiplexer 136.

After initially using the preselected phase provided via the decoder multiplexer 136, the CDR component 106 then uses the preselected clock phase (stored and set at input "CDR phase") via the decoder multiplexer 136 to enable the data sampler 110 and the edge sampler 112 using phase information obtained during the CDR operation. During the acquisition, the provided clock phases are fixed, but during the CDR operation the selected phase can be changed in small steps by controlling the clock generation circuit directly (not drawn) to do further phase corrections.

The multiplexer 148 uses the received information from the data sampler 110, the edge sampler 112, and/or the counter 128 to generate a data signal and an edge signal, which are each provided along one of the paths 150 and 152 to the digital clock and data recovery processing circuitry 154, which is configured to, in turn, provide one or more output signals along a path 156 for further processing as is conventionally understood in the art of clock and data recovery and, more generally, data signal processing and therefore is not elaborated herein. Moreover, the output signal along the path 156 may also be delivered to phase interpolators (not shown) for further phase adjustment as is well understood in the art.

Figure 2:
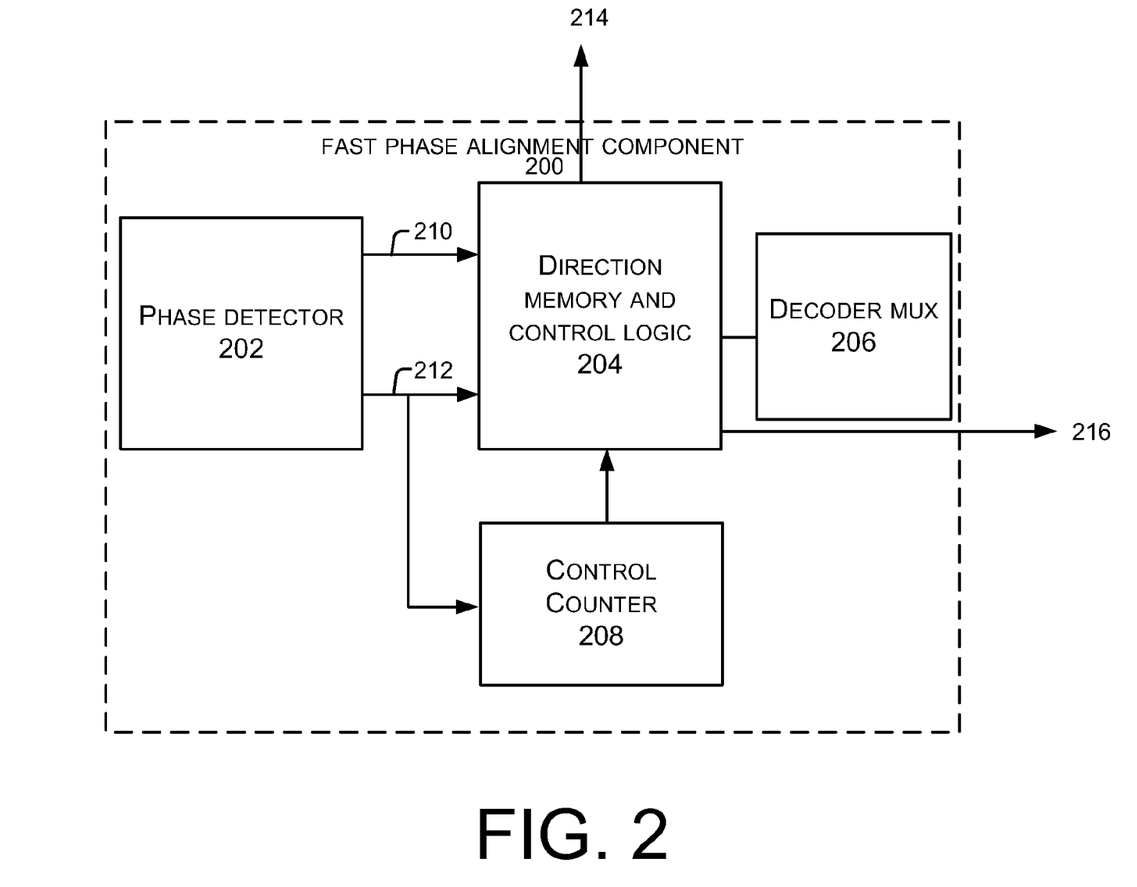
FIG. 2 is a simplified schematic diagram of an alternative system for performing a fast phase alignment function.

FIG. 2 illustrates another embodiment of a fast phase alignment component 200, which may substitute fast phase alignment component 104 for performing a fast phase alignment function. Fast phase alignment component 200 includes a phase detector 202, a direction memory and control logic component 204 a decoder multiplexer 206, and a control counter 208. The phase detector 202 and decoder multiplexer 206 operate in a manner similar or identical to the phase detector 124 and the decoder multiplexer 136 described with reference to FIG. 1 and therefore these elements are shown in a simplified form.

Similar to phase detector 124, phase detector 202 provides a direction signal along a path 210 to the direction memory and control logic component 204. A increment/decrement signal is provided along a path 212 to the direction memory and control logic component 204 and to the control counter 208. Also, the direction memory and control logic component 204 is configured to provide a phase selection signal to decoder multiplexer 206, similar to the configuration shown in FIG. 1.

The direction memory and control logic component 204 is also configured to provide information to the phase selector 116 in order to control the chosen clock phase. The control logic 204 runs through a number of operation steps, selecting several clock phases via decoder 206. With the first decision of the phase detector 202 (clock phase at 0°), the control logic 204 recognizes if the input signal slope is in the first or the second half of the unit interval (time of one data bit of the input signal). Based on this decision, it chooses the next clock phase in the middle of this half of the unit interval (clock phase at 90° or 270°). The next decision delivers the quarter of the unit interval where the input signal slope is situated. Each subsequent step divides the remaining interval by two getting nearer to the optimum sampling time point. The number of steps is dependent on the available number of different clock phases at the input of the phase selector. After log$_2$ (number of clock phases) steps (3 steps for 8 clock phases) the nearest possible point is found. The direction memory and control logic component 204 stores the previous decisions. The control counter 208 stores the number of decisions made. The control counter 208 increments each time a valid information is given by the phase detector along path 212 and provides a signal to the direction memory and control logic component 204 telling the number of steps done, i.e. the current position in operation sequence. Thus, the process results in locating the edge or an approximation of the edge of the incoming signal with an iterative process, which is faster than trying all clock phases step by step. The control counter 208 may also disable, disengage, and/or power down the direction memory and control logic component 204 to conserve power or otherwise enhance system efficiency.

Once the selected phase signal is determined, it is provided to the clock and data recovery component 106 along a path 214 in a fashion similar to that described with reference to FIG. 1. The locked-on signal is provided to the clock and data recovery component (e.g. 106) along a path 216 to indicate that the edge, or an approximation of the edge, of the incoming signal has been determined.

Figure 3:
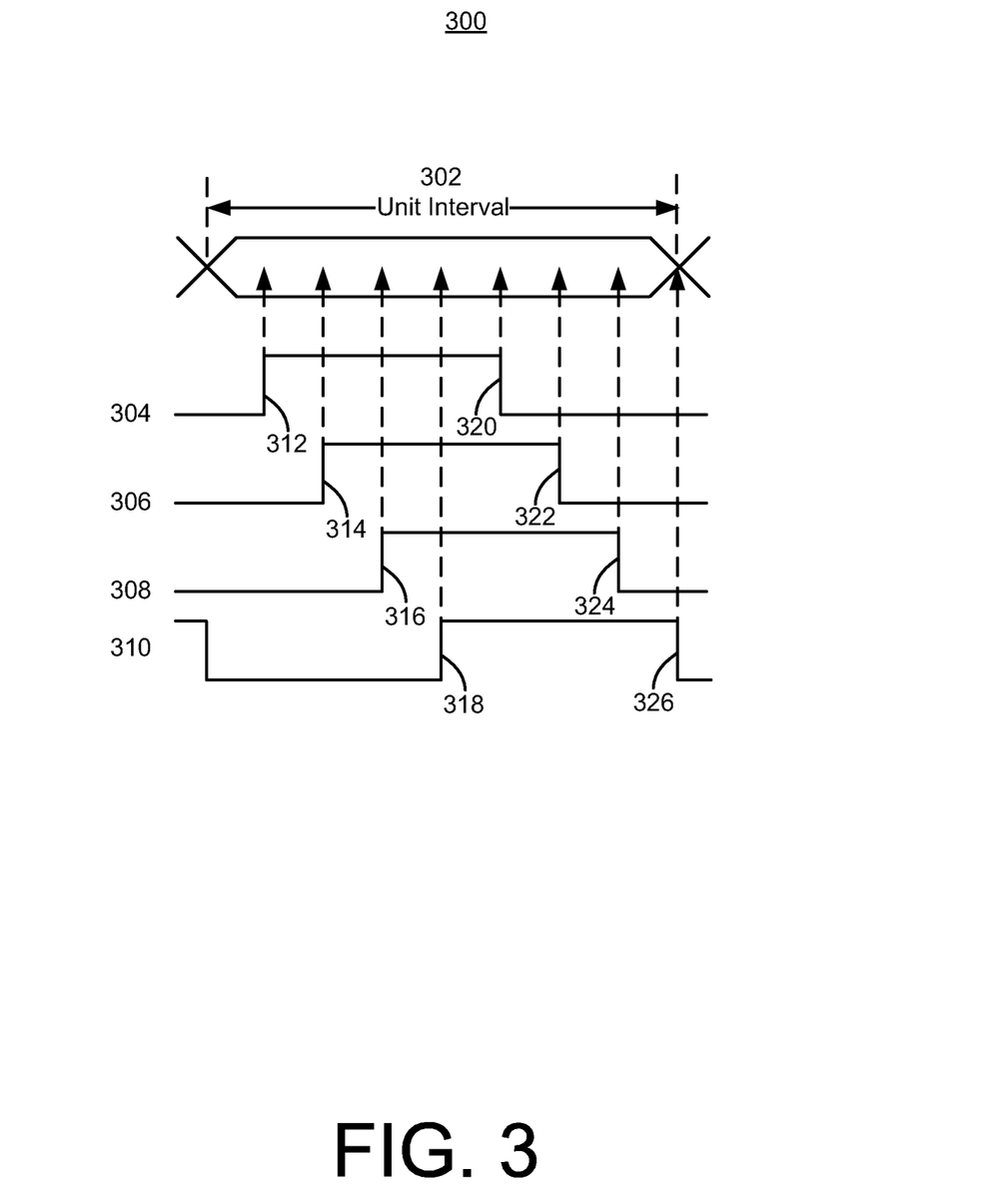
FIG. 3 is an exemplary timing diagram of sampling methods for fast phase alignment and digital clock and data recovery.

FIG. 3 illustrates a timing diagram 300 that represents the flexible use of samplers to reduce the number of clock phases used to analyze the incoming data signal 302 that is provided along the path 116 using a plurality of phases of the internally generated clock signal provided to the data sampler 110 and the edge sampler 112.

Signals 304, 306, 308, 310 represent different phases of the clock signal provided to the data sampler 110 and the edge sampler 112. Although the clock signals 304, 306, 308, 310 provided to the data sampler 110 and edge sampler 112 have different phases, they all have the same frequency. At one time only one of the clock signals is selected by the phase selector 114. One sampler, e.g. the data sampler 110, analyzes the incoming signal 302 with every rising edge 312, 314, 316, 318 and provides the results of the analysis to the phase detector 124. Another sampler, e.g. the edge sampler 112, analyzes the incoming signal 302 with every falling edge 320, 322, 324, 326 and provides the results of the analysis to the phase detector 124. Using two samplers, the incoming signal may be sampled at two different points essentially simultaneously. Thus, eight sampling points may be utilized for sampling based on only four phase adjusted clock signals.

Fast phase alignment component 104 uses an iterative process to find the edge or slope of an incoming signal. For example, the phase selector 116 first provides a first phase adjusted clock signal 304 to the data sampler 110 and the edge sampler 112 to use when analyzing the incoming signal 302. In the next iteration, the phase selector 114 may provide a second phase adjusted clock signal 306 which has a different phase than first phase adjusted clock signal 304. Because of the phase differences between the first and second phase adjusted clock signals 304 and 306, the data sampler 110 and the edge sampler 112 will analyze a different portion of the incoming signal 302, as shown by dashed lines. FIG. 3 illustrates an iterative process used to detect the edge or slope of an incoming signal to the system. For example, using the first phase adjusted clock signal 304 the data sampler 110 will obtain a value at rising edge 312 and the edge sampler 112 will obtain a value at falling edge 320 and both samplers will send that information to the phase detector 124. For the second phase adjusted clock signal 306, the data sampler 110 will obtain a value at the rising edge 314 and the edge sampler 112 will obtain a value at the falling edge 322 and both samplers 110 and 112 will send that information to the phase detector 124.

Although FIG. 3 shows equal differences in phases between the phase adjusted clock signals 304, 306, 308, 310, this is merely illustrative and other equal or non-equal increments may be selected.

Figure 4:
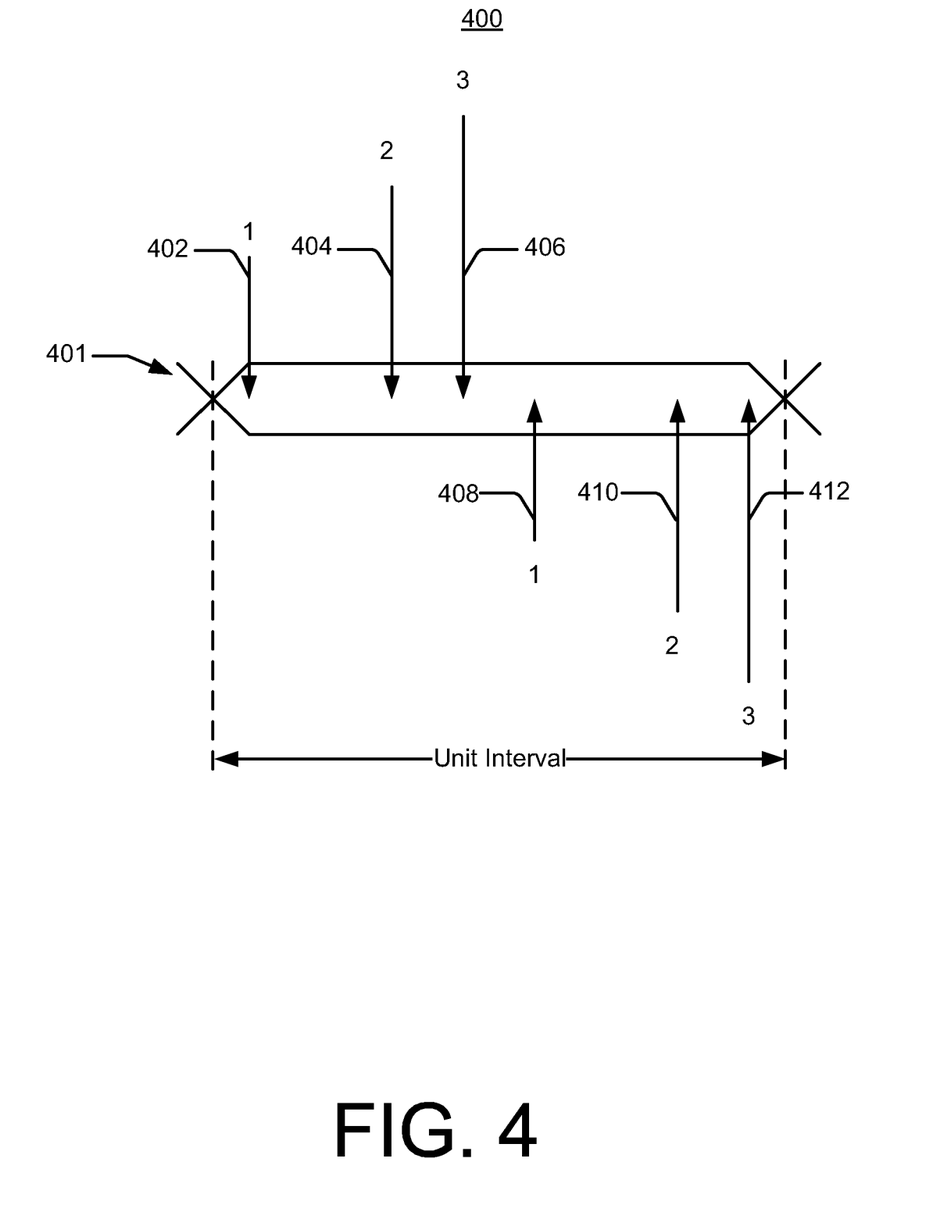
FIG. 4 is a simplified diagram of the successive approximation method for fast phase alignment.

FIG. 4 illustrates an alternative timing diagram 400 that demonstrates a successive approximation process performed by fast phase alignment component 200 that varies the phase in non-equal amounts in order to find the edge or slope of an incoming signal 401. The incoming signal 401 is analyzed using three phase adjusted clock signals with three different phases. The first phase (labeled "1") is represented by a rising edge 402 and a falling edge 408. The second phase (labeled "2") is represented by a rising edge 404 and a falling edge 410. The third phase (labeled "3") is represented by the rising edge 406 and falling edge 412. The increment (i.e. the difference in phase) between the first and second phases may be higher than the increment between the second and third phases. These different increments may be user selected or may be optimized in the system based on operating conditions and/or user expectations. Although three phases are represented in FIG. 3, a person of ordinary skill in the art would recognize the number of iterations with varying amounts of phase angles could be optimized in terms of accuracy and speed to provide a fast and accurate approximation of the location of the edge or slope of an incoming signal.

Exemplary Method

Figure 5:
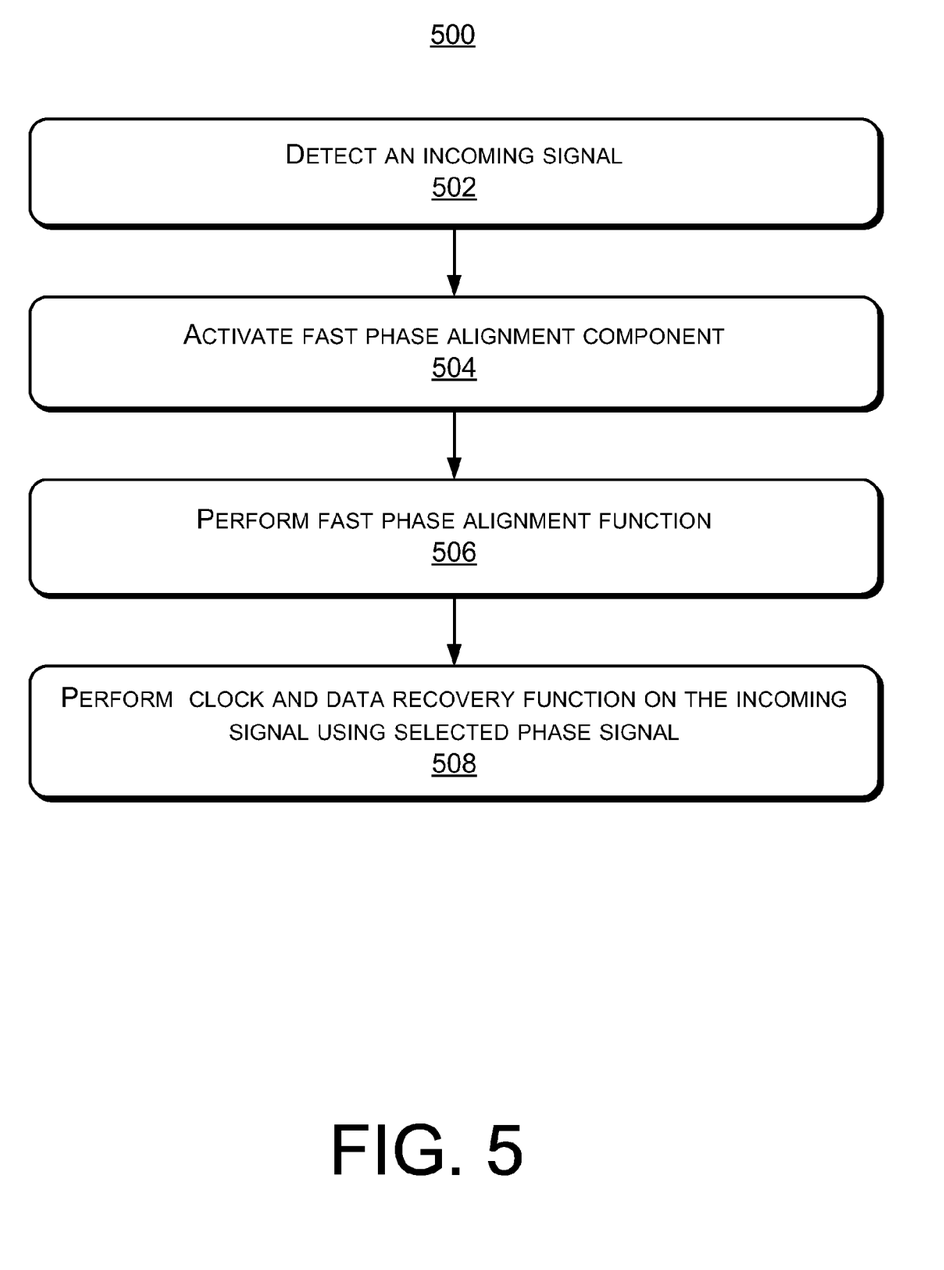
FIG. 5 is a flow diagram of a method for implementing a fast phase alignment function that provides a selected phase signal to a clock and data recovery component.

FIG. 5 illustrates a method 500 for using a fast phase alignment component in conjunction with a clock and data recovery component to quickly acquire and lock onto an incoming signal. Specifics of exemplary methods are described below. However, it should be understood that certain acts need not be performed in the order described, and may be modified, and/or may be omitted entirely, depending on the circumstances. The method 500 will be described by way of example with reference to FIG. 1.

At 502, an incoming signal is detected. For example, a signal detector 108 detects the incoming signal, a signal accompanying the incoming signal, or a precursor signal provided in advance of the incoming signal, and enables or prompts a fast phase alignment component 104 to perform a fast phase alignment function on the incoming signal. The incoming signal may be a data burst or other communication signal from another circuit or integrated circuit chip (not shown) provided along path 116.

At 504, the fast phase alignment component 104 is activated, enabled, or otherwise prompted. For example, the signal detector 108 may switch the fast phase alignment component 104 from a deactivated, or "off," state to an activated, or "on," state.

At 506, a fast phase alignment function is performed. For example, the incoming signal along path 116 is received by one or more samplers, such as a data sampler and an edge sampler associated with a CDR component 106. One or more phase adjusted clock signals are also provided to the one or more samplers that are receiving the incoming signal. The one or more samplers sample the incoming signal based on the rising and/or the falling edges of the phase adjusted clock signal. Information regarding the sampling may be processed using the fast phase alignment component 104. The fast phase alignment component 104 may direct a phase selector to select one of the provided phases of the phase adjusted clock signal in one direction or another and for one or more additional samplings. This process may be conducted iteratively until the fast phase alignment component detects or locates an edge or an approximation of an edge of the incoming signal.

The iterations in sampling may be based on equal increments/decrements or the increments/decrements may be varied, which may optimize the fast phase alignment process. More particularly, and by way of example, the process of sampling may include sampling the incoming signal based on the rising and falling edges of a first phase adjusted clock signal, a second phase adjusted clock signal, and a third phase adjusted clock signal. The three phase adjusted clock signals may each have a different phase. Moreover, according to one implementation, the difference between the phase of the first phase adjusted clock signal and the second phase adjusted clock signal is the same as the difference between the phase of the second phase adjusted clock signal and the third phase adjusted clock signal, such as described with reference to FIGS. 1 and 3. Alternatively, the difference between the phases of the first phase adjusted clock signal and the second phase adjusted clock signal may be larger than the difference between the phases of the second phase adjusted clock signal and the third phase adjusted clock signal, such as described with reference to FIGS. 2 and 4.

Once the fast phase alignment component detects or locates an edge or an approximation of an edge of the incoming signal, a locked-on signal may be generated that indicates that the selected phase signal has been determined and, thus the fast phase alignment function has been complete. Once the fast phase alignment function is complete, the fast phase alignment component 104 provides the fast phase alignment information to a CDR component 106 as a selected phase signal. The fast phase alignment component 104 may be deactivated, i.e. placed or returned to an inactive or "off" state to conserve power or otherwise enhance system efficiency.

At 508, a clock and data recovery function is performed on the incoming signal using the selected phase signal. For example, the selected phase signal may be provided to the data and edge samplers of a CDR component 106. The CDR component 106 may use the selected phase as a starting point to locate optimal data and edge sampling points for the incoming signal.

Conclusion

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A system comprising:
   a fast phase alignment component configured to generate a selected phase signal based on an edge of an incoming signal, wherein the selected phase signal includes at least an approximation of a phase of an edge of the incoming signal;
   a signal detector configured to detect, the incoming signal and activate the fast phase alignment component in response to detecting the incoming signal, wherein activating the fast phase alignment component comprises switching the fast phase alignment, component from a deactivated or off state to an activated or on state;
   a clock and data recovery component configured to receive the selected phase signal and perform a clock and data recovery function on the incoming signal using the selected phase signal; and
   at least one sampler configured to receive the incoming signal and one or more phase adjusted clock signals;
   wherein the sampler is configured to sample the incoming signal based on rising and falling edges of a first phase adjusted clock signal, to sample the incoming signal based on rising and falling edges of a second phase adjusted clock signal, and to sample the incoming signal based on rising and falling edges of a third phase adjusted clock signal,
   wherein the second phase adjusted clock signal has a different phase than the first phase adjusted clock signal,
   wherein the third phase adjusted clock signal has a different phase than the first phase adjusted clock signal or the second phase adjusted clock signal, and
   wherein the difference between the phases of the first phase adjusted clock signal and the second phase adjusted clock signal is larger than the difference between the phases of the second phase adjusted clock signal and the third phase adjusted clock signal.

2. The system according to claim 1, further comprising:
   a phase selector configured to provide one or more phase adjusted clock signals, each phase adjusted clock signal having a phase that is adjusted relative to a clock signal and having a rising edge and a falling edge.

3. The system according to claim 2, wherein the at least one sampler comprises a first sampler to sample the incoming signal and a second sampler to sample the incoming signal on a falling edge of the one or more phase adjusted clock signals.

4. The system according to claim 3, wherein one of the first and second samplers is an edge sampler associated with the clock and data recovery component and the other of the first and second samplers is a data sampler associated with the clock and data recovery component.

5. The system according to claim 4, wherein the fast phase alignment component comprises:
a phase detector configured to receive information from the first and second samplers and to generate an increment/decrement signal and a direction signal in response to receiving the information from the first and second samplers;
a direction memory and control logic configured to receive the increment/decrement signal and the direction signal and to store information regarding the incoming signal based on the increment/decrement and direction signal; and
a control counter configured to receive and monitor the increment/decrement signal.

6. The system according to claim 5, wherein the direction memory and control logic is configured to provide a signal that directs the phase selector to increment or decrement the phase of the internally generated clock signal, the number of increments being dependent on the available number of clock phases at the input of the phase selector.

7. The system according to claim 6, wherein the direction memory and control logic counter is further configured to determine an amount to increment or decrement the phase of the phase adjusted clock signal, the amount to increment the phase being based upon the difference between phase adjusted clock signal and a unit interval.

8. The system according to claim 4, wherein the fast phase alignment component comprises;
a phase detector configured to receive information from the first and second samplers and to generate an increment/decrement signal and direction signal in response to receiving the information from the first and second samplers;
a counter configured to receive the increment/decrement signal and the direction signal and to store information regarding the incoming signal based on the increment/decrement and the direction signal; and
a lock detector configured to receive the increment/decrement signal and the direction signal and to detect a direction change in the direction signal.

9. The system according to claim 8, wherein the counter is configured to provide a signal that directs the phase selector to increment or decrement the phase of the internally generated clock signal by a preselected amount.

10. A method comprising:
performing a fast phase alignment function using a fast phase alignment component to determine a selected phase signal that has a phase characteristic based on a characteristic an incoming signal, wherein performing a fast phase alignment function comprises:
receiving the incoming signal and one or more phase adjusted clock signals into at least one sampler component;
sampling the incoming signal based on the rising edge, the falling edge, or both the rising and failing edges of one or more of the phase adjusted clock signals, wherein sampling the incoming signal comprises:
sampling the incoming signal based on the rising and failing edges of a first phase adjusted clock signal;
sampling the incoming signal based on the rising and falling edges of a second phase adjusted clock signal, the second phase adjusted clock signal having a different phase than the first phase adjusted clock signal; and
sampling the incoming signal based on the rising and falling edges of a third phase adjusted clock signal, wherein the third phase adjusted clock signal has a different phase than the first phase adjusted clock signal or the second phase adjusted clock signal, and wherein the difference between the phases of the first phase adjusted clock signal and the second phase adjusted clock signal is larger than the difference between the phases of the second phase adjusted clock signal and the third phase adjusted clock signal; and
detecting an edge or an approximation of an edge of the incoming signal; and
performing a clock and data recovery function on the incoming signal using the selected phase signal, the a dock and data recovery function performed using a clock and data recovery component.

11. The method according to claim 10, wherein the characteristic of the incoming signal is an edge, or an approximation of an edge, of the incoming signal.

12. The method according to claim 10, wherein the fast phase alignment function comprises generating a locked-on signal that indicates that the selected phase signal has been determined.

13. The method according to claim 10, further comprising:
prior to performing the fast phase alignment function, detecting the incoming signal or a precursor signal and, in response, activating the fast phase alignment component to perform the fast phase alignment function, wherein activating the fast phase alignment component comprises switching the fast phase alignment component from a deactivated or off state to an activated or on state.

14. The method according to claim 13, further comprising:
prior to performing the clock and data recovery function, deactivating the fast phase alignment component, wherein deactivating the fast phase alignment component comprises disabling or powering down the fast phase alignment component.

15. A system comprising:
a fast phase alignment component configured to generate a selected phase signal based on an edge of an incoming signal, wherein the selected phase signal includes at least an approximation of a phase of an edge of the incoming signal, wherein the fast phase alignment component is configured to provide a locked-on signal to activate the clock and data recovery component and to deactivate the fast phase alignment component, wherein deactivating the fast phase alignment component comprises disabling or powering down the fast phase alignment component;
a clock and data recovery component configured to receive the selected phase signal and perform a clock and data recovery function on the incoming signal using the selected phase signal; and
at least one sampler configured to receive the incoming signal and one or more phase adjusted clock signals;
wherein the sampler is configured to sample the incoming signal based on rising and falling edges of a first phase adjusted clock signal, to sample the incoming signal based on rising and falling edges of a second phase adjusted clock signal, and to sample the incoming signal based on rising and falling edges of a third phase adjusted clock signal,
wherein the second phase adjusted clock signal has a different phase than the first phase adjusted clock signal,
wherein the third phase adjusted clock signal has a different phase than the first phase adjusted clock signal or the second phase adjusted clock signal, and wherein the difference between the phases of the first phase adjusted clock signal and the second phase adjusted clock signal is larger than the difference between the phases of the second phase adjusted clock signal and the third phase adjusted clock signal.

* * * * *